United States Patent
Yano et al.

(10) Patent No.: US 6,756,652 B2
(45) Date of Patent: Jun. 29, 2004

(54) SEMICONDUCTOR MEMORY DEVICE WITH EFFICIENTLY LAID-OUT INTERNAL INTERCONNECTION LINES

(75) Inventors: Kenji Yano, Hyogo (JP); Teruhiko Amano, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/455,420

(22) Filed: Jun. 6, 2003

(65) Prior Publication Data

US 2004/0089913 A1 May 13, 2004

(30) Foreign Application Priority Data

Nov. 8, 2002 (JP) ........................................ 2002-325465

(51) Int. Cl.[7] .............................................. H01L 29/00
(52) U.S. Cl. ...................................................... 257/508
(58) Field of Search ................................ 257/508, 208, 257/296

(56) References Cited

U.S. PATENT DOCUMENTS 5,062,077 A * 10/1991 Takashima et al. ........... 365/69
5,625,234 A * 4/1997 Suzuki et al. ................ 257/773
6,326,695 B1 * 12/2001 Numata ....................... 257/776
6,680,501 B2 * 1/2004 Ito et al. ...................... 257/296

FOREIGN PATENT DOCUMENTS

JP        11-87641        3/1999

* cited by examiner

*Primary Examiner*—David Nelms
*Assistant Examiner*—Quoc Hoang
(74) *Attorney, Agent, or Firm*—Burns, Doane, Swecker & Mathis, L.L.P.

(57) ABSTRACT

In a dummy word line region, a second metal interconnection line is arranged, and a connection between a low-resistive metal interconnection line constituting a word line arranged in a normal word line region and a lower gate electrode line is shifted. In a bit line twisting region, a memory cell gate electrode line is arranged to interconnect the gates of access transistors of memory cells, and a twisted bit line structure is implemented utilizing an upper metal interconnection line. A memory cell array region can more efficiently be used.

7 Claims, 12 Drawing Sheets

SEMICONDUCTOR MEMORY DEVICE WITH EFFICIENTLY LAID-OUT INTERNAL INTERCONNECTION LINES

BACKGROUND OF THE INVENTION

1. Field of the Invention

The present invention relates generally to semiconductor memory devices and particularly to interconnection layout of semiconductor memory devices having word lines and/or bit lines of a multi-layered interconnection structure.

2. Description of the Background Art

In dynamic random access memory (DRAM), a memory cell is comprised of a capacitor storing data and an access transistor for reading storage data, or stored electric charges in the capacitor on a bit line. The electric charges stored in the capacitor of the memory cell is read on the bit line and a voltage appearing on the bit line is amplified by a sense amplifier, to internally read the data stored in the memory cell.

The bit lines are arranged in a folded bit line arrangement, in which bit lines are arranged in pair on one side of the sense amplifier. In this folded bit line arrangement, a memory cell data is read on one of paired bit lines and the voltage of the other bit line is used as a reference voltage, and a corresponding sense amplifier differentially amplifies the voltages of the bit line pair to read the memory cell data.

Since the bit lines are arranged adjacently to each other in parallel, when noise is generated in a bit line pair, the noise is generated onto both of the paired bit lines in a common phase. Since the sense amplifier differentially amplifies the voltages of a corresponding bit line pair, such common phase noise can be cancelled and memory cell data can be sensed and amplified while eliminating an effect of the noise.

However, depending on storage data of selected memory cells, the voltages on bit lines of adjacent bit line pairs may vary in opposite directions in sensing operation. When this voltage variation is transmitted to an adjacent bit line through a capacitive coupling between bit lines, a bit line voltage varies to prevent accurate read out of memory cell data due to reduction in sensing margin or the change to reverse data.

In order to reduce an effect of noise due to parasitic capacitance between adjacent bit line pairs, a twisted bit line structure is proposed, for example, in Japanese Patent Laying-Open No. 11-87641, in which a bit line pair is provided with a crossing to reduce parasitic capacitance between the bit lines of adjacent bit line pairs.

According to the twisted bit line arrangement of the prior art document as described above, the bit lines in a pair are arranged in parallel on different interconnection layer using first and second metal interconnection lines with connection of the first and second metal interconnection lines exchanged at a predetermined portion, for implementing the twisted bit line structure. A memory cell is connected to the lower, first metal interconnection line.

In the above prior art document, an active region having a memory cell formed therein is provided with a bit line contact to positionally exchange the first and second metal interconnection lines to implement the twisted structure. Providing the twisting bit line contact in the active region can prevent an increase in area of a memory cell array that would be caused when a memory cell-free region is provided dedicatedly to a bit line contact.

In the prior art document, however, where a word line and a bit line are orthogonally arranged to each other, in order to connect the upper bit line to the lower bit line at the bit line twisting portion, the upper bit line is deviated positionally in the direction of the word line to assure a bit line contact region. Therefore, bit line spacing is reduced in the twist formation region, and a bit line pitch is determined by the spacing between bit lines in the twist region at an interlayer contacting region. Thus, if bit lines are arranged with a further reduced pitch according to shrinking of a memory cell, a sufficient interlayer contact region for the twisted bit line arrangement cannot be assured.

Further, in the prior art document, a bit line is arranged extending over the contact region for the twisted bit line arrangement, and a memory cell is connected to the protruding portion of the bit line, in order to use the active region more efficiently. However, bit lines of the lower layer on a common column are separated, and in the separation region a lithography dummy word line is arrange. A memory cell connected to the lithography dummy word line is not used for storing data. Therefore, in the bit line crossing region, the active region is not efficiently used.

Furthermore, in the prior art document, a word line is formed of an interconnection line below the first metal interconnection line for the bit line. As a word line structure, however, a word line structure of a single layer is used. As a word line structure for driving a word line to a selected state at high speed, a word line shunt structure or a hierarchical word line structure is normally employed. Therefore, if as a word line, a gate electrode line (a row select line) connecting to a gate of an access transistor of a memory cell and an upper shunting low-resistance metal interconnection line or a main word line are arranged, the first and second metal interconnection lines cannot be used for a bit line. The prior art document does not consider a combination of such a multi-layer word line of a word line shunt structure or a hierarchical word line structure and a twisted bit line structure.

The prior art document further fails to consider such a bit line structure that complementary bit lines are formed of interconnection lines of a common interconnection layer and an interconnection line of a different layer is used only at a twisted portion for positionally exchanging bit lines.

Furthermore, in a construction such as a system LSI having a semiconductor memory device and a logic integrated on a common semiconductor chip, the number of interconnection layers is limited to reduce a step between the semiconductor memory device and the logic. In a DRAM, there exist, as internal voltage, a large number of kinds of voltages such as a sense power supply voltage used by a sense amplifier, a high voltage transmitted to a selected word line, a bit line precharge voltage for precharging a bit line, a cell plate voltage transmitted to a cell plate of a capacitor of a memory cell, a substrate bias voltage applied to a substrate region of a memory cell array.

These voltages need to be supplied stably to corresponding circuit portions. As for the sense power supply voltage supplied to a sense amplifier, a sense power supply line is arranged in a meshed shape over a memory array. In the meshed shape sense power supply line arrangement, a sub sense power supply line is arranged in a word line shunt region in a row direction and connected to the sense power supply line in a sense amplifier band having sense amplifiers arranged therein. Therefore, this sense power supply line is not arranged over the memory array efficiently in a column direction.

SUMMARY OF THE INVENTION

An object of the present invention is to provide a semiconductor memory device having an internal interconnection layout allowing an array area to be used efficiently.

Another object of the present invention is to provide a semiconductor memory device having a twisted bit line arrangement implementing a reduced array area.

A still another object of the present invention is to provide a semiconductor memory device having a word line shunt structure and a twisted bit line arrangement implementing a reduced array area.

A further object of the present invention is to provide a semiconductor memory device having a multi-layer interconnection structure allowing memory cells to be arranged efficiently.

The semiconductor memory-device according to an aspect of the present invention includes a plurality of memory cells arranged in rows and columns and a plurality of row select lines arranged corresponding to the memory cell rows and each connecting to memory cells on a corresponding row. The memory cells include normal memory cells storing data and dummy cells for maintaining geometry of the normal memory cells. The row select line include a normal row select line connecting to the normal memory cells and a dummy row select line connecting to the dummy cells.

The semiconductor memory device according to one aspect of the present invention further includes a plurality of bit line pairs arranged corresponding to the memory cell columns and each connecting to memory cells on a corresponding column. The plurality of bit line pairs are each selectively have a crossing at a preallocated twisting regions, and in the twisting region, a row select line is arranged and a crossing is formed of an interconnection line above the row select line and bit line.

The semiconductor memory device according to the one aspect of the present invention further includes a plurality of low-resistive conductive lines arranged, in a region other than the twisting region in correspondence with the row select lines, extending in the row direction and electrically connected in a predetermined region to corresponding row select lines. The low-resistive conductive line is formed in an interconnection layer above the row select lines.

The semiconductor memory device according to the one aspect of the present invention further includes a connection line connecting the low-resistive conductive line in the predetermined region to a corresponding row select line. The connection line includes a first connection line for electrically connecting the row select line arranged in the twisting region and the corresponding low-resistive conductive line, and a second connection line for electrically connecting a normal row select line with the low-resistive conductive line arranged corresponding to a dummy row select line.

The semiconductor memory device according to another aspect of the present invention includes a plurality of memory cells arranged in rows and columns and a plurality of row select lines arranged corresponding to the memory cell rows and connecting to memory cells on corresponding rows. The plurality of memory cells include normal cells storing data and dummy cells arranged in a predetermined region The plurality of row select lines include a normal row select line and a dummy row select line. The dummy row select line is arranged in the predetermined region concentrately.

The semiconductor memory device according to the another aspect of the present invention further includes a plurality of low-resistive conductive lines provided corresponding to and above the plurality of row select lines, and a plurality of connection lines electrically connecting the plurality of low-resistive conductive lines with the normal row select line. The connection line includes a first connection line for electrically connecting a low-resistive conductive line arranged in the predetermined region to a normal row select line.

The semiconductor memory device according to a further aspect of the present invention includes a memory array having a plurality of memory cells arranged in rows and columns and storing data, and a plurality of bit line pairs arranged corresponding to the memory cell columns and each connecting to memory cells on a corresponding column. Each bit line pair includes first and second bit lines. The first and second bit lines selectively have a crossing in a predetermined region. The crossing portion has first and second interconnections arranged therein. The first and second bit lines outside the crossing region are formed of the first interconnection lines.

The semiconductor memory device according to the further aspect of the present invention further includes a plurality of row select lines arranged corresponding to the memory cell rows and each connecting to memory cells on a corresponding row. The plurality of row select lines are formed of interconnection lines below the interconnection layer of the first interconnection lines, and the plurality of row select lines include an externally accessible row select line formed in the predetermined region and connected to a row of memory cells arranged in the predetermined region.

Arranging a row select line in the bit line twisting region enables an effective usage of an array area, and increased storage capacity can be achieved without increase in array area. Furthermore, by arranging a low-resistive conductive line in correspondence to a dummy row select line and connecting the low-resistive conductive line to a normal row select line, a region for arranging an interconnection for word line shunt can be used as a region for arranging different interconnection lines. For example, even if a twisted bit line arrangement is implemented with an interconnection of the same layer as a word line shunting, low-resistive conductive line, a word line shunting interconnection can be arranged so as to avoid the bit line twisting region, and a word line can be lined (a row select line and a low-resistive conductive line can be connected). A word line shunting structure and a twisted bit line arrangement can thus be implemented without increase in array area.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 14 schematically shows another example of connection of the through hole and contact for the word line shunt in accordance with the first of the present invention in;

DESCRIPTION OF THE PREFERRED EMBODIMENTS

First Embodiment

Figure 1:
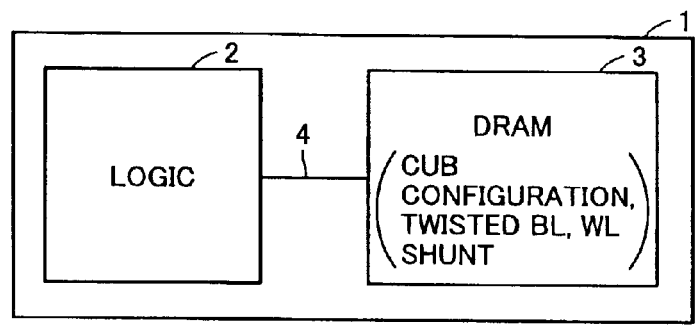
FIG. 1 schematically shows an entire configuration of a semiconductor integrated circuit device including a DRAM having the present invention applied thereto.

FIG. 1 schematically shows an entire configuration of a semiconductor integrated circuit device including a semiconductor memory device according to the present invention. In FIG. 1, a semiconductor integrated circuit device 1 includes a logic 2 performing a predetermined processing and a DRAM 3 storing data required by logic 2. Logic 2 and DRAM (dynamic random access memory) 3 are integrated on a common semiconductor chip and interconnected through an on-chip internal interconnection (lines) 4. Logic 2 and DRAM 3, interconnected through on-chip internal interconnection 4, can rapidly transfer signals/data. In addition, on-chip internal interconnection 4 is not connected to a pin terminal. Therefore, there is no constraint by pitch condition of the pin terminal and a transfer data bit width can be widened and an increased data transfer bandwidth can be implemented.

In semiconductor integrated circuit device 1, with a CMOS logic process used as a basic process, DRAM 3 is assembled mixedly with logic 2 on a common chip. To fabricate DRAM 3 and logic 2 through common fabrication processes as many as possible, for DRAM 3, the steps such as forming a bit line with tungsten and forming a bit line direct contact for electrically connecting a bit line directly to a field region (an active region) are not performed, and a first metal interconnection line used in logic 2 is used as a bit line BL.

To form a contact making electrical connection from bit line BL directly to the field region, and to reduce a step between logic 2 and DRAM 3, a memory cell is reduced in height.

A DRAM cell includes a memory cell capacitor storing information in an electric charge form, and this memory capacitor has a cell plate electrode supplied with a fixed voltage and a storage node electrode storing electric charges corresponding to data. Both the cell plate electrode and the capacitor electrode are disposed below bit line BL. The structure that a memory cell capacitor lies below a bit line, i.e., a capacitor under bit line (CUB) structure is employed.

Furthermore, for a word line connecting to a row of memory cells, a word line shunt (WL shunt) configuration is employed, as will be described later, in order to transmit a row select signal at high speed. For bit line BL, a twisted bit line arrangement is employed, as will be described later more specifically, to accurately sense data of a memory cell.

Figure 2:
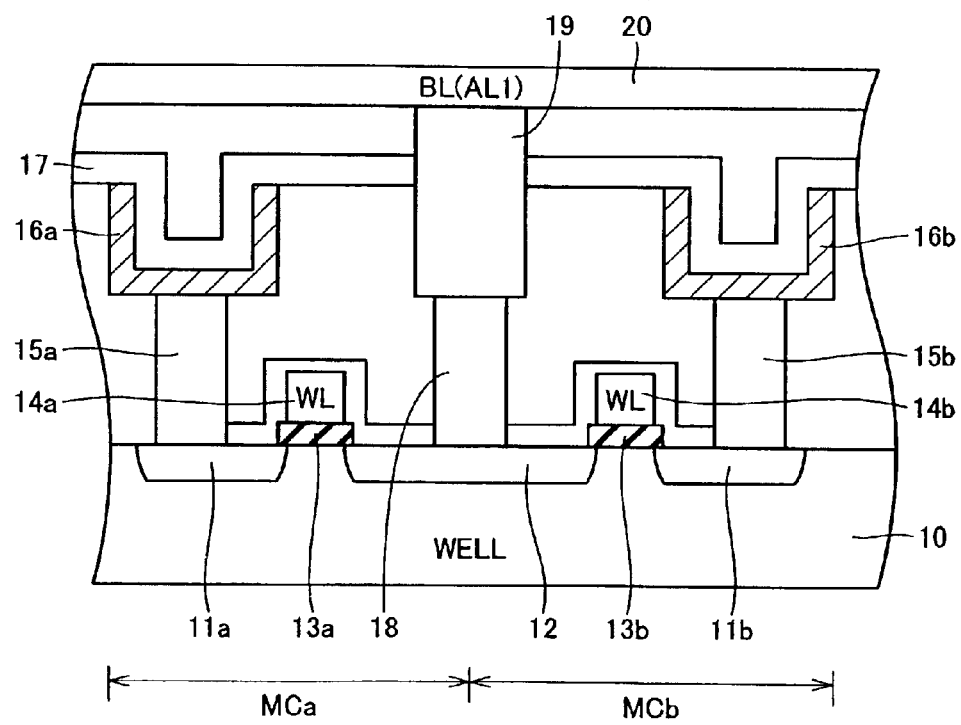
FIG. 2 schematically shows a cross sectional structure of a memory cell of the semiconductor memory device according to the present invention.

FIG. 2 schematically shows a cross sectional structure of a memory cell capacitor of the CUB structure. FIG. 2 shows representatively across sectional structure of memory cells MCa and MCb provided in a well region 10. When a memory cell transistor is formed of an N channel MOS transistor (an insulated gate field effect transistor), well region 10 is a P well region.

In FIG. 2, memory cell MCa includes impurity regions 11a and 12 formed, spaced from each other, at a surface of well region 10, a gate electrode 14a disposed between impurity regions 11a and 12b with a gate insulation film 13a underlaid, a buried plug 15a electrically connected to impurity region 11a, a storage node electrode 16a connected to buried plug 15a, and a cell plate electrode 17 disposed facing to storage node electrode 16a with a capacitor insulation film (not shown) placed in between. Impurity region 12 is electrically connected to a conductive line 10, which forms bit line BL, through buried plug 18 and a contact 19. Conductive line 20 forming bit line BL is formed of a metal line such as a first aluminum interconnection (AL1) line, or a copper interconnection line.

Memory cell MCb includes impurity regions 11b and 12 disposed, space from each other, at a surface of well region 10, a gate electrode 14b disposed in a region between impurity regions 11b and 12 with a gate insulation film 13b placed therebetween, a buried plug 15b electrically connected to impurity region 11b, a cell plate electrode 16b electrically connected to buried plug 15b, and a cell plate electrode 17 arranged facing to cell plate electrode 16b with a capacitor insulation film (not shown) placed in between.

Cell plate-electrode 17 is arranged extending over a memory cell array and is provided commonly to a plurality of memory cells. Storage node electrodes 16a and 16b are provided corresponding to the memory cells, respectively.

Gate electrodes 14a and 14b form a word line WL and are each formed, for example, of a first polysilicon interconnection line. Memory cell MCa has a capacitor formed by a region at which storage node electrode 16a and cell plate electrode 17 face to each other, and memory cell MCb has a capacitor formed by a region at which storage node electrode 16b and cell plate electrode 17 face to each other. Cell plate electrode 17 and storage node electrodes 16a and 16b are arranged below bit line BL. This capacitor structure with a memory cell capacitor below bit line BL is referred to as the CUB structure.

If cell plate electrode 17 and storage node electrode 16a both are arranged above bit line BL, i.e., a capacitor over bit (COB) structure is employed, buried plugs 15a and 15b are arranged corresponding to the respective memory cells and between bit lines. This buried plug functions as an inter-bit line shield layer to reduce inter-bit line parasitic capacitance. In the CUB structure, however, conductive line 20 forming bit line BL lies above a memory cell capacitor and between adjacent bit lines, and there does exist a buried plug electrically connecting a storage node electrode and a memory cell impurity region. Therefore, in this CUB structure, there does exist a storage node contact functioning as a shield layer between bit lines BL and an inter-bit line capacitance is increase. In particular, if an integration degree is increased and an inter-bit line pitch is decreased, an inter-bit line coupling capacitance is increased, while the memory cell capacitor stores a reduced amount of electric charges. Accordingly, a reduced amount of electric charges of data of a memory cell is read on a bit line (a read voltage is reduced), resulting in increase in effect of variation of a bit line voltage due to the inter-bit line capacitive coupling. To reduce an effect of capacitive coupling by the inter-bit line parasitic capacitance to achieve accurate sensing operation, bit line BL is formed into the twisted bit line arrangement.

As described previously, word line WL is formed into a word line shunt (WL shunt) configuration to transfer a word line select signal at high speed. In this word line shunt configuration, a low-resistive metal conductive line such as a copper, or aluminum line is arranged in parallel with and above a first polysilicon interconnection (a gate electrode) constituting a gate of a memory cell transistor, and at predetermined intervals, the low-resistive metal interconnection line and the lower memory cell transistor gate electrode line are interconnected. This arrangement reduces the resistance of a word line formed by the gate electrode line.

Figure 3:
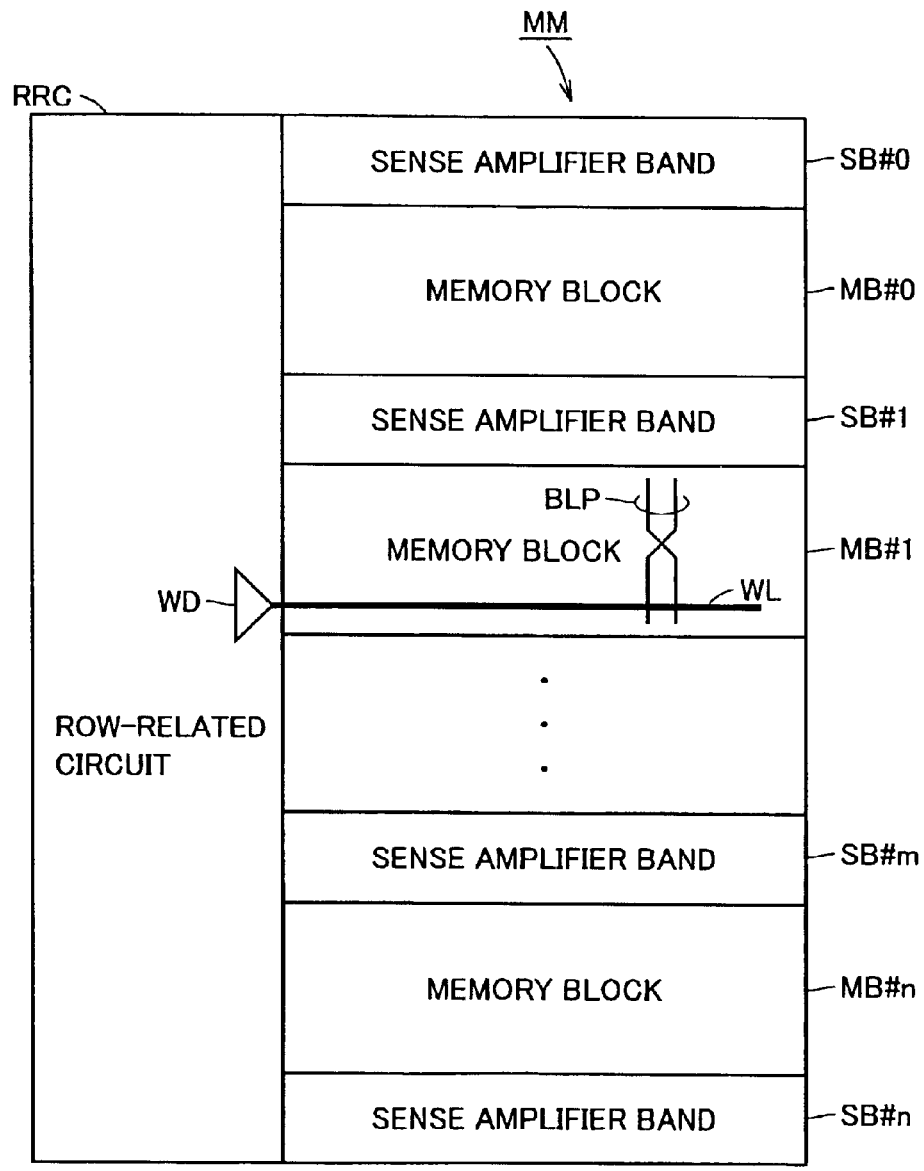
FIG. 3 schematically shows a configuration of an array portion of the DRAM shown in FIG. 1.

FIG. 3 schematically shows a construction of an array portion of DRAM 3 shown in FIG. 1. In FIG. 3, a memory array MM includes memory blocks MB#0 to MB#n each having a plurality of memory cells arranged in rows and columns. In memory blocks MB#0 to MB#n, word line WL is arranged corresponding to a row of memory cells, and bit line pairs BLP are arranged corresponding to columns of memory cells, respectively. FIG. 3 shows word line WL and bit line pair BLP in memory block MB#1 representatively. Bit line pair BLP has a twisted portion and word line WL has a shunt structure.

Word line WL is arranged corresponding to a row of memory cells, and to each word line, a corresponding row of memory cells is connected. Bit line pair BLP is arranged corresponding to a column of memory cells and each column of memory cells is connected to a corresponding bit line pair BLP.

In regions between memory blocks MB#0 to MB#n, sense amplifier bands SB#0 to SB#n are arranged, and outside memory blocks MB#0 and MB#n sense amplifier bands SB#0 and SB#n are arranged. In each of sense amplifier bands MB#0 to MB#n, sense amplifiers are arranged corresponding to the columns of memory cells, which differentially amplify and latch potentials of corresponding bit line pairs when enabled.

Corresponding to memory array MM, a row-related circuit RRC is arranged to select a row of memory cells. Row-related circuit RRC includes a sense amplifier control circuit for enabling sense amplifier bands MB#0 to MB#n, a bit line isolation control circuit for controlling a connection between a selected memory block (a memory block including a selected memory cell) and a sense amplifier band, and a word line select circuit for driving an addressed word line to a selected state. In FIG. 3, in row-related circuit RRC, a word line driver WB driving word line WL to a selected state is representatively shown.

In row-related circuit RRC, control of activation and inactivation of the row select operation is made on a memory block basis, for example.

Figure 4:
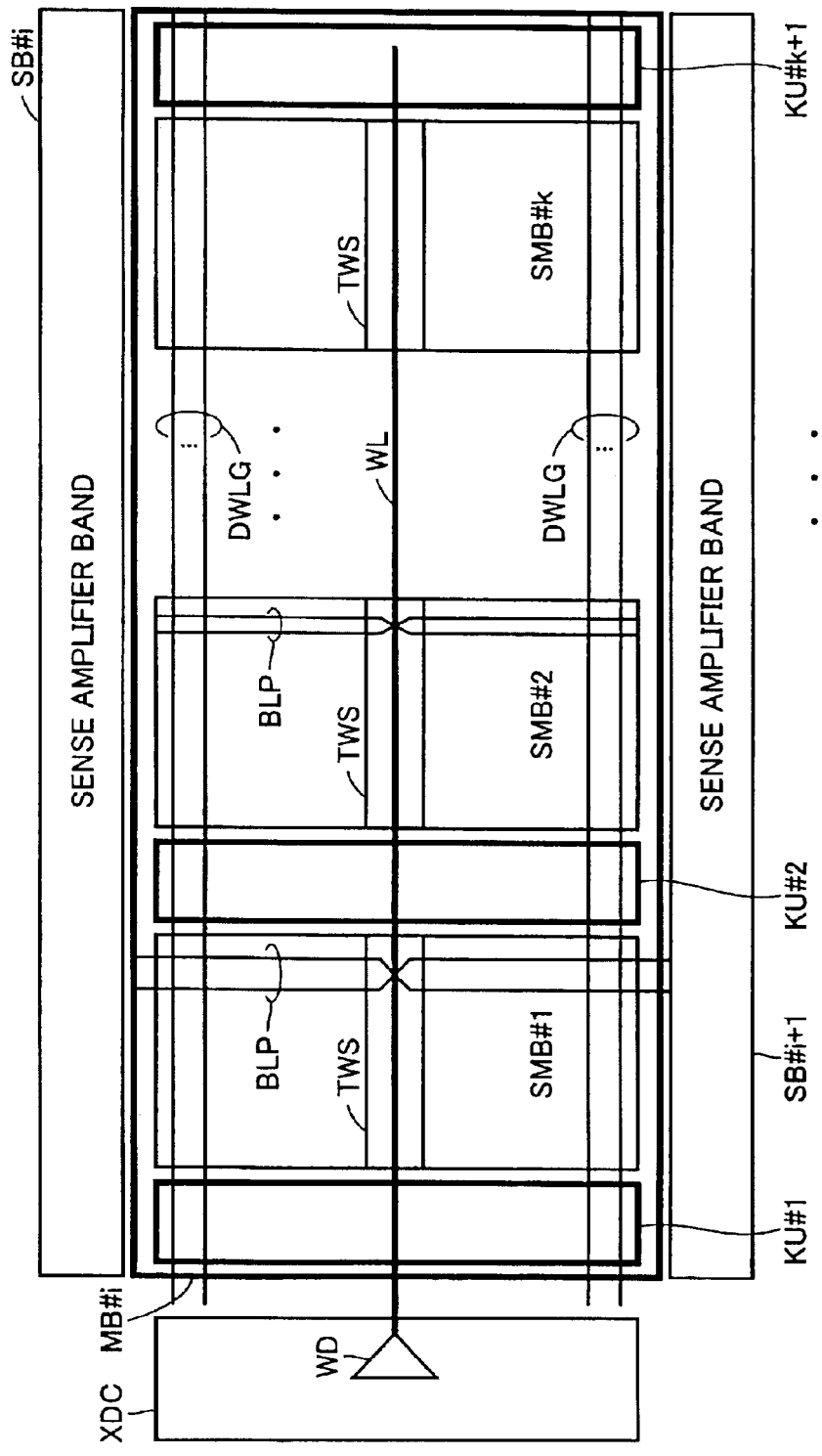
FIG. 4 schematically shows a configuration of a memory block shown in FIG. 3.

FIG. 4 schematically shows a construction of memory blocks MB#0 to MB#n shown in FIG. 3. FIG. 4 shows a construction of memory block MB#i representatively. Memory block MB#i is divided by word line shunt regions KU#1 to KU#k+1 into a plurality of sub memory blocks SMB#1 to SMB#k. In each of sub memory blocks SMB#1 to SMB#k, memory cells from 64 to 256 bits are arranged for a single row.

Sub memory blocks SMB#1 to SMB#k share word line WL. For this word line WL, a structure of which will be described later more specifically, a low-resistive conductive line formed, for example, of low-resistive interconnection material such as aluminum, or copper is connected, in shunt regions KU#1 to KU#k+1, to a gate electrode line of a memory cell transistor of a relatively high resistance. This gate electrode line interconnects gate electrodes of access transistors of memory cells on a row.

Sub memory blocks SMB#1 to SMB#k are provided with bit line twisting regions TWSs, respectively, and in bit line twisting region TWS, bit line pair BLP has a crossing or twisted portion. The number of bit line twisting regions TWSs is determined in accordance with the twisted bit line structure employed, as appropriate. FIG. 4 shows representatively a construction in which sub memory blocks SMB#1 to SMB#k is each provided with a single bit line twisting region TWS.

In this bit line twisting region TWS, word line WL is arranged, as will be described later in detail. By arranging memory cells in bit line twisting region TWS, a memory array region can be efficiently used.

On opposite sides of memory block MB#i in the column direction, sense amplifier bands SB#i and SB#i+1 are arranged. In boundary regions to sense amplifier bands SB#i and SB#i+1, a dummy word line group DWLG is arranged. Dummy word line group DWLG includes a plurality of dummy word lines. The dummy word lines (dummy cell gate electrode lines) are arranged at the same pitch as word lines WLs. Dummy word line group DWLG is provided for the following reason.

In boundaries between sense amplifier bands SB#i and SB#i+1 and sub memory block SB#i, a layout pattern of transistors varies in regularity. In other words, transistor distribution state varies. Therefore, in the actual wafer process, the variation in regularity of the pattern layout is accompanied with pattern offset due to an irregular reflection of exposure light or the like. Consequently, memory cell transistors (gate electrode lines) adjacent to a sense amplifier band are formed different in pattern from memory cell transistors arranged far inside the sub memory block. To maintain the regularity of the pattern layout, a dummy word line is arranged in a region adjacent to sense amplifier bands SB#i and SB#i+1 to maintain the regularity of the pattern layout of transistor gate electrode line of the memory cells. The dummy word lines (dummy cells) of dummy word line group DWLG are not used in accessing data. They are merely used to maintain the regularity in a lithography process step. To access data, a memory cell connected to word line WL is used.

Conventionally, in the region of dummy word line group DWLG, dummy cells are formed and a dummy cell transistor gate electrode line is simply arranged, and a shunting low-resistive conductive line is not arranged. In the present embodiment, to form a word line of a memory cell row arranged in a bit line twist region into a shunt structure, a low-resistive, conductive line is arranged corresponding to a dummy word line (a gate electrode line), and is used to form a word line arranged for normal cells (memory cells having data accessed) into the shunt structure. In other words, a gate electrode line of the normal memory cell (hereinafter simply referred to as the memory cell) and a corresponding low-resistive, conductive line are positionally shifted and connected.

For memory block MB#i, an X decode circuit XDC is arranged. In X decode circuit XDC, word line drivers WDs are arranged corresponding to word lines WLs, respectively. In X decode circuit XDC, in order to maintain regularity of a pattern layout of the word line drivers, a dummy word line driver may also be arranged corresponding to a dummy word line. This dummy word line driver may be used to drive a low-resistive, conductive line arranged in a dummy word line region to a selected state in response to an address signal, or connection between a word line driver arranged corresponding to a normal cell row and a corresponding low-resistive, conductive line may be shifted in accordance with shifting of correspondence between the low-resistive, conductive line and a gate electrode line.

Figure 5:
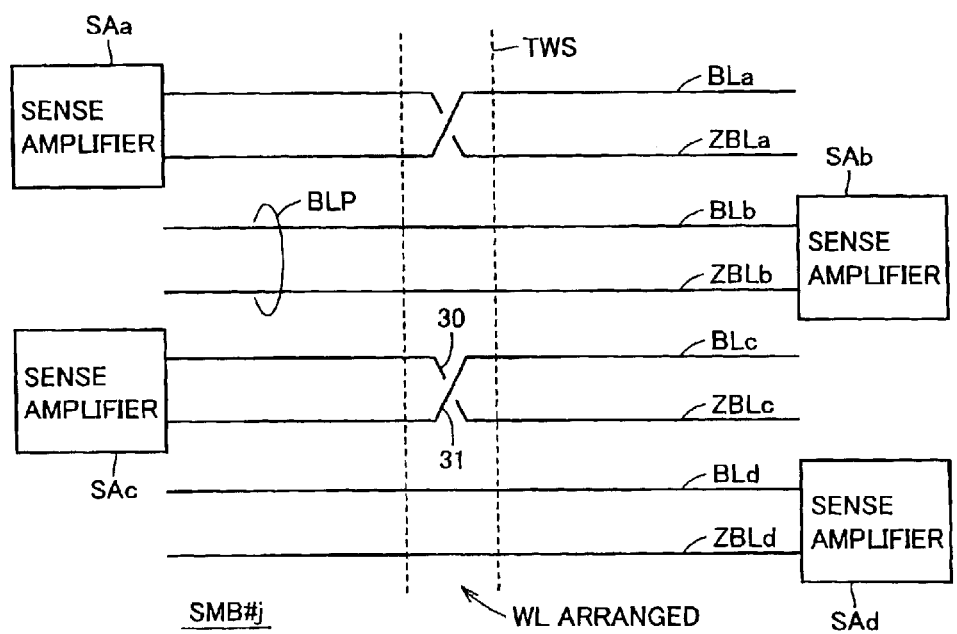
FIG. 5 shows an exemplary arrangement of bit lines of a bit line twist region in accordance with a first embodiment of the present invention.

FIG. 5 schematically shows a configuration of a bit line in the sub memory block shown in FIG. 4. FIG. 4 shows a bit line structure in sub memory block SMB#j. In FIG. 5, bit lines BLa, ZBLa to BLd, ZBLd are arranged in pairs. For pairs of bit lines BLa, ZBLa to BLd, ZBLd, sense amplifiers SAa to SAb are arranged alternately on opposite sides of the bit lines. In this sub memory block SMB#j, a single bit line twisting region TWS is arranged at a center region in the direction of the column.

Every other bit line pair BLP is provided with a crossing. In FIG. 5, the pair of bit lines BLa, ZBLa and the pair of bit lines BLc and ZBLc are provided with crossings, respectively. At the crossing, bit lines ZBLa and ZBLc are each interconnected, for example, through a second metal interconnection line 30 and bit lines BLa and BLc are each interconnected through a first metal interconnection line 31. The first and second metal interconnection lines 30 and 31 are formed with copper or aluminum being the main constituent material.

Bit lines BLa, ZBLa to BLd, ZBLd are formed of the first metal interconnection line outside bit line twisting region TWS. The first and second metal interconnection lines 31 and 30 are provided in different interconnection layers. Therefore, bit lines can be arranged without change in pitch. The upper second metal interconnection line 30 can be used as a "jumping interconnection" to provide bit lines with a crossing to positionally exchange the bit lines.

By providing every other bit line pair BLP with a crossing region to positionally exchange bit lines, a halved coupling capacitance between bit lines of adjacent bit line pairs can be achieved. For example, the bit line BLb and ZBLa are adjacent to each other in a region from sense amplifier SAb to the twist region TWS and their coupling capacitance can be reduced as compared to the case in which the crossing region is not provided.

The bit line twisting configuration of providing every other bit line pair BLP with a crossing region, as shown in FIG. 5, is referred to as a "single twisted bit line configuration."

Bit line twisting region TWS is only provided with the first and second metal interconnection lines 30 and 31. Therefore, in a region under the twist region, normal memory cells are arranged and for a row of the normal memory cells, a memory cell transistor gate electrode line formed, for example, of first polysilicon is arranged to interconnect the memory cells on a row, and accordingly word line WL is arranged.

Figure 6:
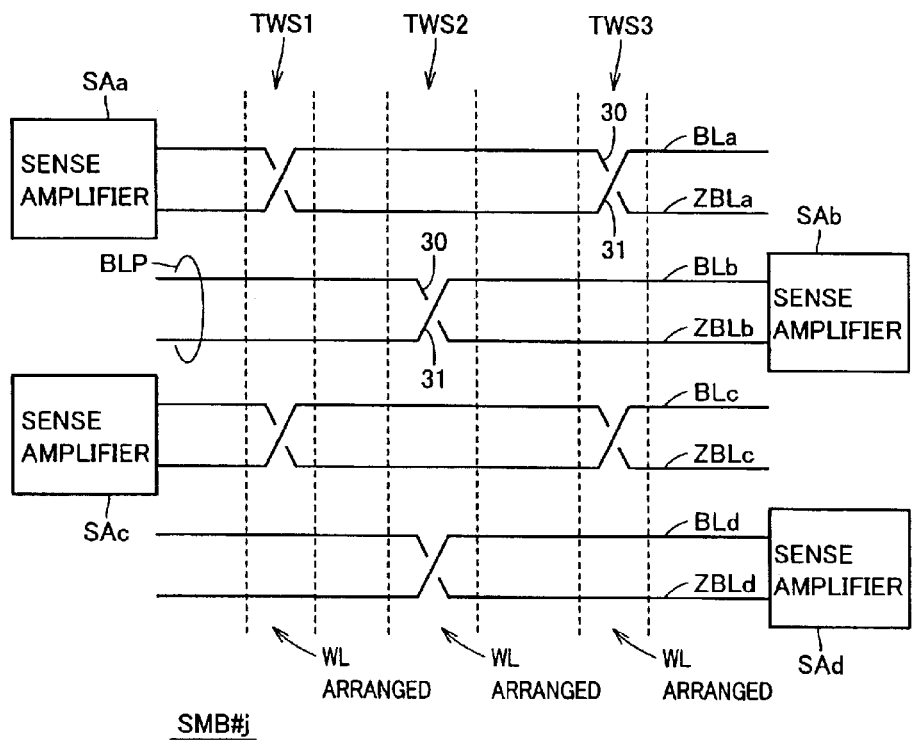
FIG. 6 shows another exemplary arrangement of a bit line crossing in the bit line twist region in the first embodiment of the present invention.

FIG. 6 shows another configuration of the bit line twisting configuration. FIG. 6 shows bit lines BLa, ZBLa to BLd, ZBLd in sub memory block SMB#j representatively. In the arrangement shown in FIG. 6, bit line twisting regions TWS1 to TWS3 are arranged, for example, at positions quartering a bit line in the column direction.

Bit lines BLa, ZBLa and BLc, ZBLc are each provided with crossings at bit line twisting regions TWS1 and TWS3. Bit lines BLb, ZBLb and BLd, ZBLd are each provided with a crossing at bit line twisting region TWS2. In the bit line twisting regions, the second and first metal interconnection lines 30 and 31 are used. Bit lines BLa, ZBLa and BLd, ZBLd are formed of the first metal interconnection lines outside the bit line twisting regions.

In the configuration of FIG. 6, adjacent bit line pairs are not provided with the crossing at the same position in the column direction, but with the crossings at different positions. Therefore, for example, bit lines BLb and ZBLa are adjacent to each other in a region from sense amplifier SAb to crossing region TWS3 and coupling capacitance between bit lines BLb and ZBLa can further be reduced.

The configuration of providing each bit line pair with a crossing region with adjacent bit line pairs having the crossings at different positions, as shown in FIG. 6, is generally referred to as a "dual twisted bit line configuration."

Other than the bit line twisting configurations shown in FIGS. 5 and 6, a bit line with a smaller number of crossings may be provided with an additional crossing in a vicinity of a sense amplifier, so as to make equal the bit line load and the number of crossings. Furthermore, more bit line twisting regions than those shown in FIGS. 5 and 6 may be arranged. It is merely required that in a bit line pair, a twisted structure is provided at a predetermined region using lines of different interconnection layers to positionally exchange bit lines in the predetermined region.

In the first embodiment, in this bit line twisting configuration, a bit line crossing is formed by the first metal interconnection line constituting a bit line and the second metal interconnection above the first metal interconnection line. In addition, memory cells are arranged on a substrate region below the bit line twisting region, and a word line (a gate electrode line) is provided corresponding to each row of memory cells.

Figure 7:
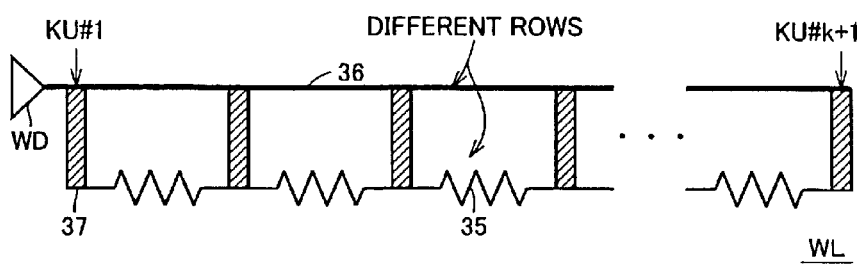
FIG. 7 schematically shows a configuration of a word line shown in FIG. 4.

FIG. 7 schematically shows a structure of a word line of a shunt configuration in accordance with the first embodiment of the present invention. Word line WL includes a low-resistive, metal interconnection line (conductive line) 36 transmitting a word line select signal from word line driver WD, a high-resistive, gate electrode line (a row select line) 35 forming a gate of a memory cell transistor, and a shunting contact 37 electrically connecting interconnection lines 36 and 35 in shunt regions KU#1–KU#k+1. Owing to electrical connection of interconnection lines 36 and 35 through shunting contact 37, resistance of word line WL can be equivalently reduced to reduce signal propagation delay on word line WL.

In the first embodiment, low-resistive, metal interconnection line 36 and a corresponding gate electrode line 35 are arranged in different rows, or arranged corresponding to different rows, viewed in a planar layout. Therefore, low-resistive, metal interconnection line 36 is formed of the second metal interconnection line, and the second metal interconnection line is positionally shifted by the first metal interconnection line and electrically connected to the corresponding gate interconnection line. Therefore, equivalently, shunting contact 37 includes the first metal interconnection line for position shift, and a contact for electrically connecting the shifting, first metal interconnection line to a corresponding gate electrode line.

Low-resistive, metal interconnection line 36 is arranged in a row different from a bit line twisting region, and relation between metal interconnection line 36 and a corresponding gate electrode line 35 to be connected is shifted. In a bit line twisting region, a row of memory cells, i.e., gate electrode line 35 is arranged. Although not particularly noted, when a gate electrode line of memory cells is formed, a corresponding row of memory cells is formed as well.

Figure 8:
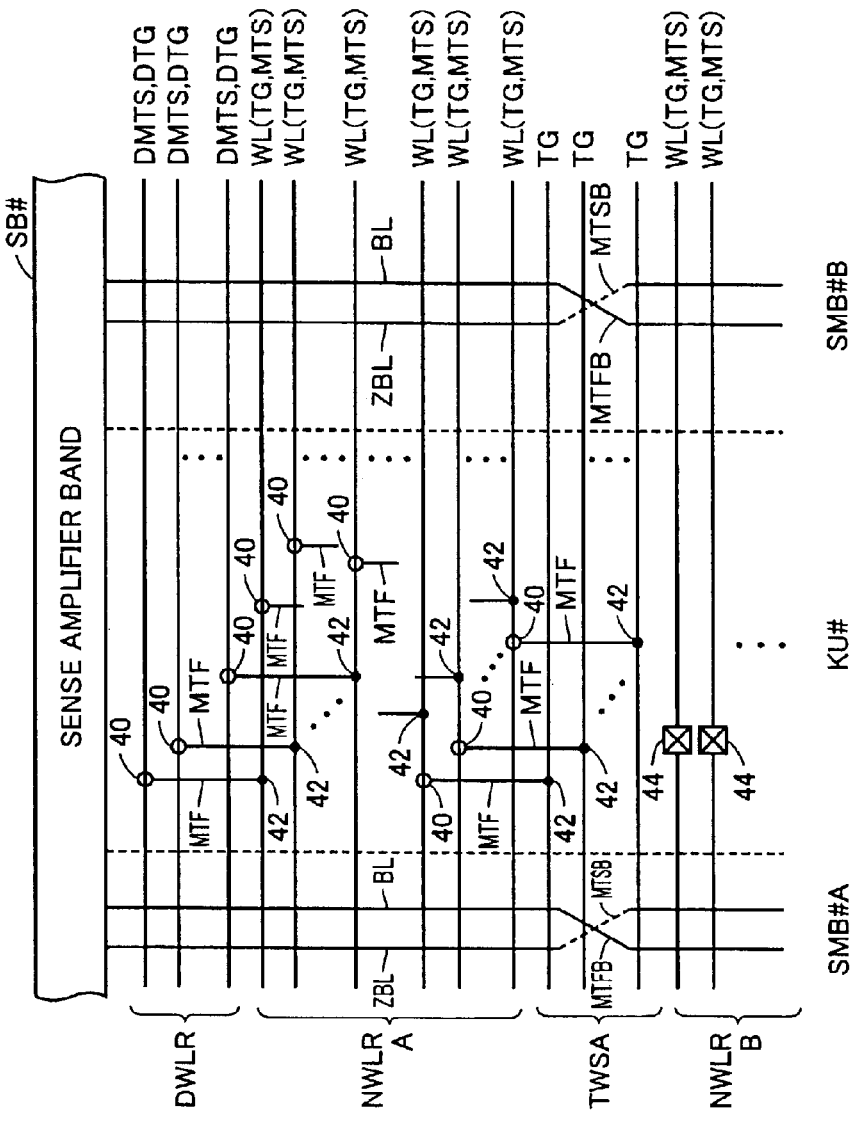
FIG. 8 shows an arrangement of word lines in accordance with the first embodiment of the present invention.

FIG. 8 schematically shows a layout of word line-shunt in a word line shunt region, and particularly a configuration of a portion corresponding to word line shunt region KU#. In a word line shunt region KU#, no bit line is arranged, and therefore, no memory cell is arranged.

Adjacent to sense amplifier band SB#, dummy word line region DWLR for arranging a dummy word line is provided. In dummy word line region DWLR, a dummy gate electrode line DTG corresponding to a conventional dummy word line and a dummy metal interconnection line DMTS above dummy gate electrode line DTG in alignment are arranged. Dummy metal interconnection line DMTS is formed of the second metal interconnection line. To dummy gate electrode line DTG, a row of dummy cells (dummy cell transistor) are connected.

Adjacent to dummy word line region DWLR, a normal word line region NWLRA having a normal word line arranged is provided. In normal word line region NWLRA, word lines WLs each having a row of memory cells connected are arranged extending in the row direction. Word line WL includes a gate electrode line TG of memory cell transistors connecting to a row of memory cells (memory cell transistor gates), and a second metal interconnection line MTS arranged above and in alignment with memory cell transistor gate electrode line TG.

In a bit line twisting region TWSA, gate electrode line TG of memory cell transistors is arranged extending in the row direction. Therefore, in the bit line twisting region, a predetermined number of rows of memory cells are arranged in alignment and the memory cells on each row have their access transistors connected to corresponding gate electrode line TG.

Although not particularly noted in the following description, if gate electrode line TG is provided, a row of memory cells is arranged for each gate electrode line, and the memory cells on a row have the gate electrodes of the access transistors interconnected by gate electrode line TG.

Dummy metal interconnection line DMTS arranged in dummy word line region DWLR is electrically connected through a shifting interconnection line MTF extending in the column direction, a through hole 40 and a contact 42 to gate electrode line TG of memory cell transistors of word line WL arranged in normal word line region NWLRA. The second metal interconnection line MTS formed in each word line WL is also connected by shifting interconnection line MTF via through hole 40 to a gate electrode line of memory cell transistors arranged in a different row. Shifting interconnection line MTF is formed by the first metal interconnection line.

In bit line twisting region TWSA, the second metal interconnection MTS arranged to correspond to word line WL arranged in normal word line region NWLRA are connected to gate electrode lines TG of memory cell transistors via through holes 40, shifting interconnection lines MTFs and contacts 42. Therefore, gate electrode lines TGs of memory cell transistors formed in bit line twisting region TWSA are all connected via shifting interconnection lines MTF to the second metal interconnection lines arranged in normal word line region NWLRA, and equivalently a word line shunt configuration is implemented.

The low-resistive, second metal interconnection line and the corresponding gate electrode line are spaced by a predetermined number of rows. Word lines are associated with shifting interconnection lines MTF of a common length, and with the same signal propagation delay. However, if shifting interconnection line MTF is the low-resistive, first metal interconnection line and the signal propagation delay due to difference in interconnection length is negligible, the shifting interconnection lines may be different in length. In this case, a constraint on the layout of the connection between the second metal interconnection line MTS and a gate electrode line is mitigated and shifting interconnection line MTF can efficiently be arranged.

If the number of dummy metal interconnection lines DMTSs arranged in dummy word line region DWLR and that of gate electrode lines TGs of memory cell transistors arranged in bit line twisting region TWSA are equal, then in normal word line region NWLRB, at each word line WL, gate electrode line TG of memory cell transistors is electrically connected through a via hole 44 to the second metal interconnection line MTS arranged above memory cell transistor gate electrode line TG in alignment. In this example, between normal word line regions NWLRA and NWLRB, word line shunt interconnection lines are different in length by shifting interconnection lines MTF. However, as shown in FIG. 7, shunting contacts are connected in parallel in each word line, so that if shifting interconnection lines MTFs are made equal in length, a variation in signal propagation delay due to shifting interconnection line MTF can be eliminated. Thus, an effect of signal propagation delay in a shunting contact due to shifting interconnection line MTF can be set to a sufficiently negligible value. Alternatively, a contact of via hole 44 may have its resistance value adjusted to compensate for an effect of signal propagation delay due to shifting interconnection line MTF.

Sub memory blocks SMB#B and SMB#A are arranged on opposite sides of word line shunt region KU#. In sub memory blocks SMB#A and SMR#B, bit lines BL and ZBL are paired and arranged extending in the column direction. In this bit line twisting region TWSA, bit lines BL and ZBL are positionally exchanged by crossing interconnection lines MTSB and MTFB. Here in FIG. 8, bit line BL has its position exchanged, for example, by a first metal interconnection line MTFB and bit line ZBL has its position exchanged via a second metal interconnection line MTSB.

In a region other than bit line twisting region TWSA, bit lines BL and ZBL are each formed by the first metal interconnection line MTFB and have a corresponding column of memory cells connected thereto. In bit line twisting region TWSA, accordingly, the first and second metal interconnection lines MTSB and MTFB are only arranged for a bit line. In this bit line twisting region TWST, gate electrode line TG (memory cell) of memory cell transistors below the first metal interconnection line MTFB can be arranged without affecting a twisted bit line structure.

Accordingly, an increased number of word lines or memory cell rows can be arranged in sub memory blocks SMB#a and SMB#b, and accordingly an area penalty of a bit line twisting region can be eliminated to reduce the memory array area and accordingly a chip area.

The bit line twisting configuration may be either single or dual twist configuration. A memory cell (memory cell transistor gate electrode line TG) is arranged in a bit line twisting region, and in a dummy word line region, a dummy metal interconnection line is formed of an interconnection line on the same interconnection layer as the second metal interconnection line for word line lining. By utilizing the dummy metal interconnection line in the dummy word line region for word line lining, in each word line, a second metal interconnection line and a gate electrode line of memory cell transistors arranged in different rows can electrically be connected in a shunt region and accordingly a memory cell gate electrode line arranged in a bit line twisting region can be lined with a metal interconnection line.

Considering the number of gate electrode lines of memory cells (memory cell rows) arranged in the bit line twisting region, the number of dummy word lines (dummy transistor gate electrode lines) arranged in a dummy word line region and the number of upper dummy metal interconnection lines are determined.

Figure 9:
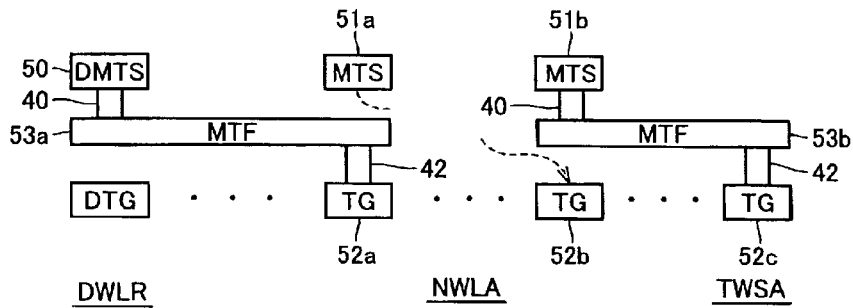
FIG. 9 schematically shows a cross sectional structure of a word line shown in FIG. 8.

FIG. 9 schematically shows a cross sectional construction of a shunting portion of word line shunt region KU# shown in FIG. 8. In FIG. 9, in a dummy word line region, there are provided a dummy gate electrode line TG and a dummy metal interconnection line (DMTS) 50 formed, for example, of the second metal interconnection line in alignment with dummy gate electrode line DTG. No dummy cell is provided in the shunt region. Dummy gate electrode line DTG is arranged extending in the row direction.

Dummy metal interconnection line (DMTS) 50 is electrically connected to a shifting interconnection line (MTF) 53a through a through hole 40. Shifting interconnection line (MTF) 53a is electrically connected via contact 42 to a memory cell transistor gate electrode line TG) 52a included in a word line spaced by a predetermined number of rows. In alignment with memory cell transistor gate electrode line (TG) 52a, a low-resistive, metal interconnection line (MTS). 51a is arranged to be coupled through a through hole, indicated by a broken line, with a memory cell gate electrode line arranged in a different row. In a region other than the shunt region, a memory cell is formed corresponding to gate electrode line TG.

A memory cell transistor gate electrode line (TG) 52b, arranged at a boundary of normal word line region NWLA and bit line twisting region TWSA, is electrically connected to a low-resistive, metal interconnection line arranged on a different row in normal word line region NWLA. In alignment with gate electrode line (TG) 52b, a low-resistive metal; interconnection (MTS) 51b is arranged, which is electrically connected to shifting interconnection line (MTF) 53b through through hole 40. Shifting interconnection line (MTF) 53b is electrically connected to memory cell transistor gate electrode line (TG) 52c arranged in the bit line twisting region via contact 42.

Figure 10:
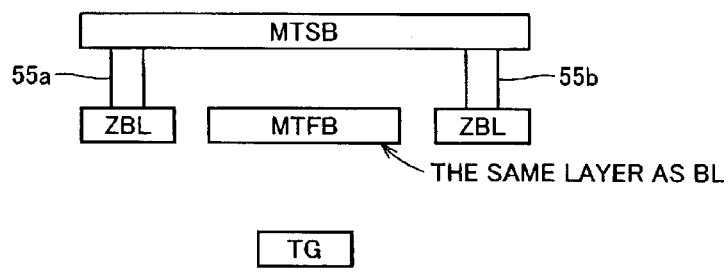
FIG. 10 schematically shows a cross sectional structure of a bit line twist region shown in FIG. 8.

FIG. 10 schematically shows a cross sectional construction of the bit line twisting portion shown in FIG. 8. As shown in FIG. 10, bit line ZBL is coupled with a twisting metal interconnection line MTFB through through holes 55a and 55b. Twisting metal interconnection line MTFB is arranged above an interconnection line MTFB connecting a bit line (BL). Metal interconnection line MTFB and bit line ZBL are both of the first metal interconnection line. Bit line ZBL and shifting connecting metal interconnection line MTFB lies above memory cell transistor gate electrode line TG. Twisting metal interconnection line MTFB is the second metal interconnection line. Therefore, memory cell transistor gate electrode line TG (memory cell) can be arranged without any adverse effect on the twisted bit line arrangement. At the bit line twisting portion, a memory cell is formed corresponding to gate electrode line TG.

In this configuration, a bit line is also formed in the bit line twisting region continuously and rows of memory cells can also be arranged successively in the column direction. In the bit line twisting region, a lithography dummy cell to maintain a pattern regularity is not arranged, and a memory cell arranged in the bit line twisting region can be used as a memory cell for data storage, and memory cells can efficiently be arranged in a memory array.

Modification

Figure 11:
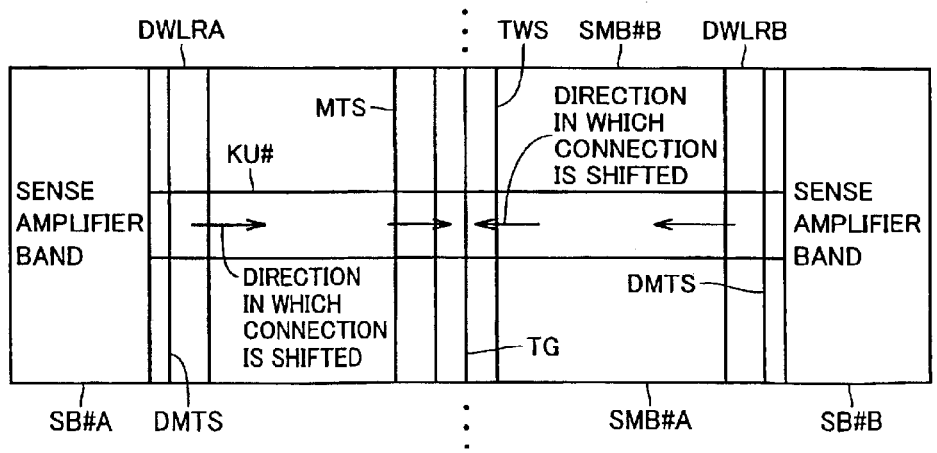
FIG. 11 schematically shows a configuration of an example of a modification of the first embodiment.

FIG. 11 schematically shows a configuration of an array portion of the semiconductor memory device according to a modification of the first embodiment. In FIG. 11, shunt region KU# divides a memory block into two sub memory blocks SMB#A and SMB#B. On opposite sides of sub memory blocks SMB#A and SMB#B, sense amplifier bands SB#A and SB#B are arranged opposite to each other. Adjacent to sense amplifier band SB#A, a dummy word line region DWLRA is arranged, and adjacent to sense amplifier band SB#B, a dummy word line region DWLRB is arranged. In each of dummy word line regions DWLRA and DWLRB, a dummy metal interconnection line DMTS is arranged in alignment with a dummy word line (a dummy transistor gate electrode line).

A bit line twisting region TWS is provided at a center in the column direction in sub memory blocks SAB#B and SAB#A. In bit line twisting region TWS, memory cell transistor gate electrode line TG is arranged (a memory cell is arranged).

In the arrangement shown in FIG. 11, with dummy metal interconnection lines DMTSs arranged in dummy word line regions DWLRA and DWLR arranged on opposites sides, a connection between low-resistive metal interconnection line MTS and gate electrode line TG in a word line is shifted. Dummy metal interconnection line DMTS included in dummy word line regions DWLRA and DWLRB can be used to line the memory cell transistor gate electrode line TG arranged in bit line twisting region TWS by the second metal interconnection line.

By using dummy cell interconnection lines DMTS on opposite sides of sub memory blocks SMB#A and SMB#B to set a shifting direction of a connection between a low-resistive, conductive line (the second metal interconnection line) and a gate electrode line to a direction of the center portion, a connection of lining lines can be shifted for all word lines, a shifting interconnection line for a lining contact in each word line can be uniformed in length, and the signal propagation characteristics of word lines can be made uniform.

Second Modification

Figure 12:
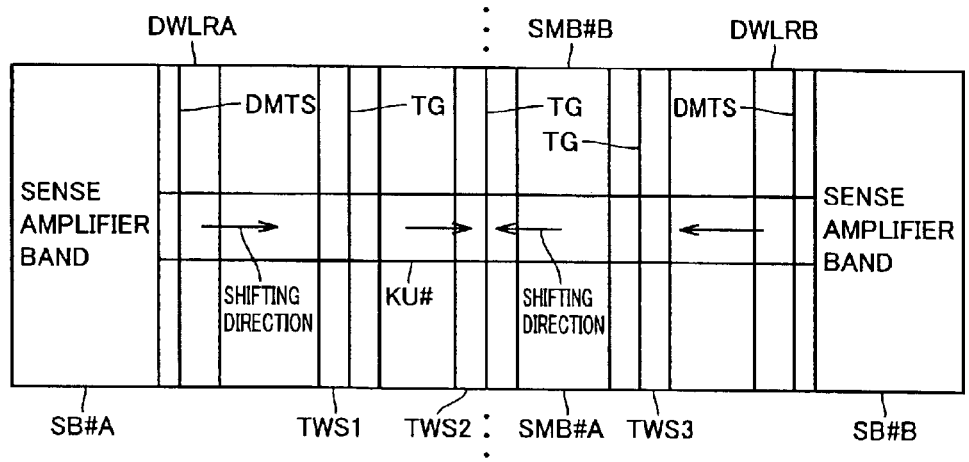
FIG. 12 schematically shows a configuration of a second modification of the first embodiment.

FIG. 12 schematically shows the construction of the modification of the first embodiment. The arrangement shown in FIG. 12 differs from that shown in FIG. 11 in the following points. Sub memory blocks SMB#A and SMB#B are provided with three bit line twisting regions TWS1, TWS2 and TWS3. In each of bit line crossing regions TWS1 to TWS3, memory cell gate electrode lines TGs, or memory cells, are arranged The other construction of FIG. 12 is identical to that of the FIG. 11. Accordingly, like portions are denoted by like reference characters, and detailed description will not be repeated.

In the arrangement shown in FIG. 12, bit line twisting regions TWS1 to TWS3 each allow a predetermined number of memory cell gate electrode lines TGs to be arranged therein, and an array area can be more efficiently used to increase the number of word lines. In this modification, dummy metal interconnection lines DMTS from dummy word line regions DWLRA and DWLRB arranged on opposite sides of memory blocks SMB#A and SMB#B are used to implement a shifted connection between a low-resistive, metal interconnection line and high-resistive gate electrode line. By using dummy metal interconnection lines DMTS arranged in the opposite dummy word line regions, memory cell gate electrode line TG provided in each of bit line twisting region TWS1 to TWS3 can be lined with the second metal interconnection line.

Furthermore, by increasing a shifting distance of a connection of the second metal interconnection line and the gate electrode line beyond a width of bit line twisting regions TWS1 to TWS3, the connection of the second metal interconnection line and the gate electrode line can be shifted to line all memory cell gate electrode lines with the second metal interconnection lines.

First Arrangement of Shifting Interconnection Line

Figure 13:
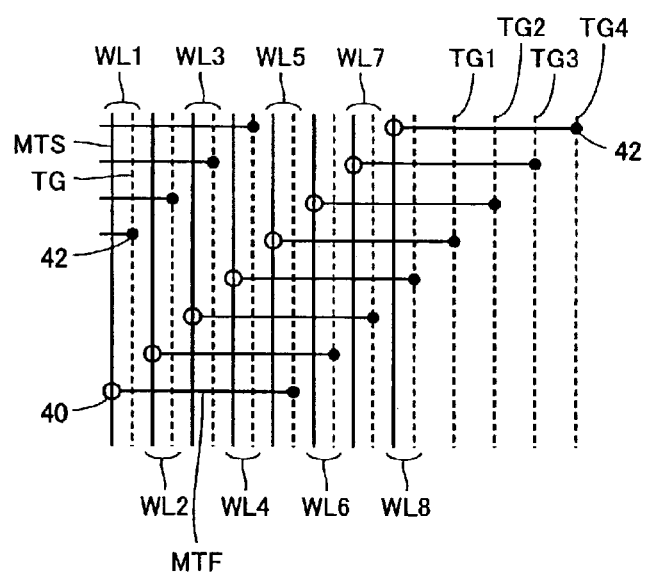
FIG. 13 schematically illustrates connection of through hole and contact for word line shunt in accordance with first embodiment of the present invention.

FIG. 13 schematically shows an arrangement of a shifting interconnection line of shifting of word line lining in the first embodiment. FIG. 13 shows word lines WL1 to WL8 and memory cell gate electrode lines TG1 to TG4 arranged in a twisting region. In the bit line twisting region, four gate electrode lines are arranged by way of example. To line the four gate electrode lines with metal, a connection of the second metal interconnection line is shifted by four word lines.

In FIG. 13, word line WL1 to WL8 are each formed by memory cell gate electrode line TG and upper low-resistive metal interconnection line (the second metal interconnection line) MTS. Interconnection lines MTS and TG in each word line WL1 to WL8 are arranged to overlap with each other, viewed in a planar layout. To explicitly show connection, metal interconnection line MTS and gate electrode line TG in FIG. 13 are shown being displaced.

To line the four word lines, for the second metal interconnection MTS, through hole 40 is arranged regularly with a cycle corresponding to eight word lines. Each second metal interconnection line MTS is connected by shifting interconnection line (the first metal interconnection line) MTS to gate electrode line TG of a word line arranged being offset in position by four rows. Through contact 42, shifting interconnection line MTF and gate electrode line TG are electrically connected to each other. Since interconnection lines MTS and TG overlap with each other, viewed in a planar layout, shifting interconnection lines MTF are arranged for metal interconnection lines MTS and gate electrode lines TG, respectively, sequentially in accordance with a pattern (cycle) of eight word lines.

In this arrangement, word lines WL1 to WL4 have metal interconnection lines MTS electrically connected through through holes 40 to gate electrode lines TG of word lines WL5 to WL8 via contacts 42. Word lines WL5 to WL8 have metal interconnection lines MTS electrically connected to memory cell gate electrode lines TG1 to TG4, respectively, via through holes 40, shifting interconnection lines MTF and contacts 42.

As shown in FIG. 13, by connecting successively arranged metal and gate electrode lines to corresponding, successive word lines or transfer gates, a common pattern can repeatedly be arranged to prove through holes and contact holes to facilitate a pattern layout of shifting interconnection lines.

Second Arrangement of Shifting Interconnection Line

Figure 14:
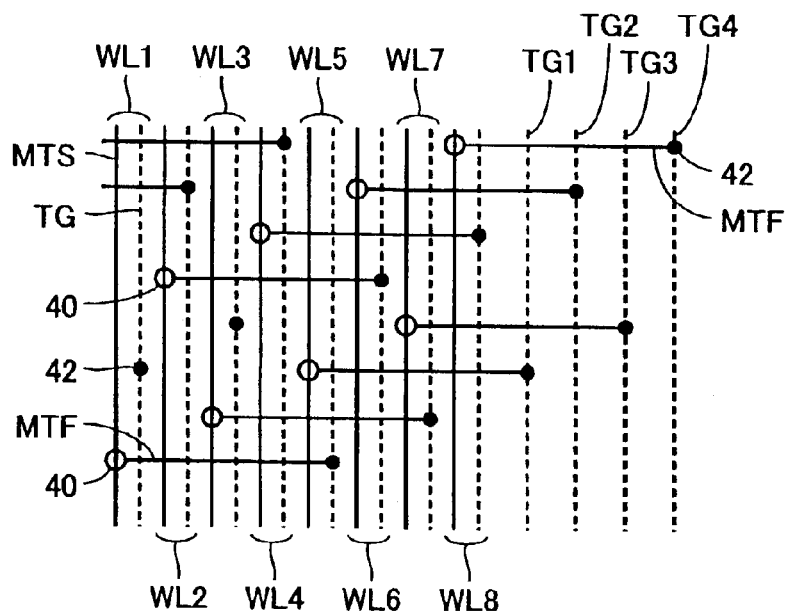

FIG. 14 shows a second arrangement of connection of metal interconnection for word line shunt. FIG. 14 shows word lines WL1 to WL8 and memory cell gate electrode lines TG1 to TG4 arranged in a bit line twisting region. Word lines WL1 to WL8 each include low-resistive metal interconnection line MTS and high-resistive memory cell gate electrode line TG aligned in a planar view.

In the arrangement of FIG. 14, through holes 40 for metal interconnection lines MTS are arranged for alternate word lines sequentially in the column direction. Through holes 40 are repeatedly arranged in a cycle of four shifting interconnection lines MTFs, depending on the number of word lines (memory cell gate electrode lines) arranged in the bit line twisting region. For word lines WL1, WL3, WL5 and WL7, through holes 40 are sequentially formed, and word lines WL1 and WL3 are connected through the first metal interconnection lines MTF to word lines WL5 and WL7 at gate electrode lines TG via contacts 42. Word lines WL5 and WL7 have their low-resistive metal interconnection lines MTSs electrically connected to gate electrode lines TG1 and TG3, respectively.

Successively in the layout, for word lines WL2, WL4, WL6 and WL8 through hole 40 is sequentially formed, and these word lines are electrically connected via contacts 42 to gate electrode lines TG spaced away by three word lines. Therefore, word line WL2, WL4 have their metal interconnection lines MTSs electrically connected to the gate electrode lines TGs of word lines WL6 and WL8. Word lines WL6, WL8 have their metal interconnection lines electrically connected through through holes to gate electrode lines TG2, TG4, respectively, by metal interconnection lines MTF and via contacts 42.

As shown in FIG. 14, through holes 40 are repeatedly arranged with four through holes being a unit, and within the unit, through hole 40 is arranged on every other row. Correspondingly, with four contacts being a unit, contacts are repeatedly arranged and within the contact unit, contact 42 is formed on every other row. According to such arrangement, shifting interconnection line MTF can be arranged with a uniform length for all word lines, and through hole 40 and contact 42 can each have a sufficiently large pitch. Without increase in pitch of metal interconnection line B in row direction, through hole 40 and contact 42 can be formed sufficiently and therefore, a word line shunt portion occupies a reduced area.

Third Arrangement of Shifting Interconnection Line

Figure 15:
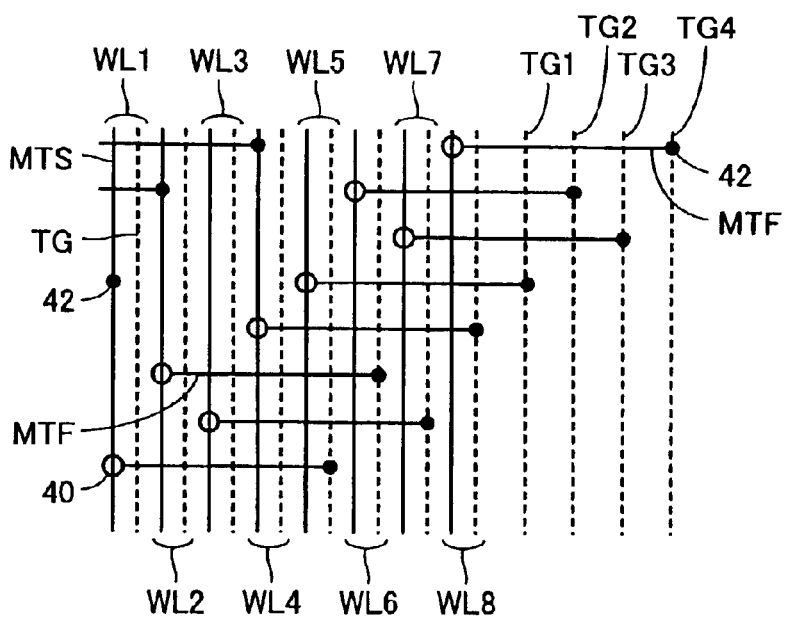
FIG. 15 schematically shows a further connection of through hole and contact for the word line shunt in accordance with the first embodiment of the present invention.

FIG. 15 schematically shows a further arrangement of connection of word line lining in the first embodiment. FIG. 15 also shows word lines WL1 to WL8, and connection of metal interconnection lines and gate electrode lines to gate electrode lines TG1 to TG4 arranged in a bit line twisting region.

In the arrangement shown in FIG. 15, two through holes 40 are employed as a unit, and within the unit, these two through holes are arranged sandwiching a word line therebetween, and the through hole unit formed by two through holes is arranged sequentially with stagger by one row Specifically, a set of two through holes arranged for successive, even-numbered word lines and a set of two through holes for successive, odd-numbered word lines are alternately arranged. With four through holes being a unit, the through holes are repeatedly arranged.

Word lines WL1 to WL4 have their metal interconnection lines MTSs connected through through-holes 40 and metal interconnection lines MTF to the gate electrode lines TGs of word lines WL5 to WL8, respectively. Similarly, word lines WL5 to WL8 have their metal interconnection lines MTSs connected through through-holes 40 to gate electrode lines TG1 to TG4 by metal interconnection lines MTF via contacts 42.

Between a pair of shifting interconnection lines MTFs connecting to a pair of successive metal interconnection lines MTSs, shifting interconnection line MTF for a metal interconnection line of a different pair from the pair of the successive metal interconnection lines is arranged.

Contact 42 is arranged corresponding to through hole 40. Accordingly, through hole 40 is arranged in the same pattern with an offset by four rows. Therefore, as for contact 42 also, between contacts for successive gate electrode lines, shifting interconnection line MTF for a different gate electrode line TG is arranged.

In the through hole unit of four through holes 40 and in the contact unit of four contacts 42, through holes or contacts are arranged for adjacent metal interconnection lines or adjacent gate electrode lines. However, within these units, contact 42 or through bole 40 is formed for a gate electrode line or a low-resistive metal interconnection line of every other row. A more sufficient area is assured for arranging through hole 40 and contact 42 than where through hole 40 or contact 42 is successively formed. Consequently, there is no necessity for increasing the pitch of metal interconnection line MTF to form through hole 40 or contact 42, so that an increase in area of a shunt region due to the shift arrangement of metal line for shunting the word lines can be suppressed.

In the arrangements in FIGS. 13 to 15, a bit line twisting region has four rows of memory cells arranged therein and correspondingly four gate electrode lines TGs (TG1–TG4) arranged therein. However, the number of gate electrode lines TGs arranged in the bit line twisting region needs only to be determined appropriately in accordance with an array configuration. Based on the number of gate electrode lines arranged in each bit line twisting region, the arrangement pattern (period) of through holes and contacts is determined.

As described so far, in the first embodiment, in a bit line twisting region, a metal interconnection line above a bit line is used to implement the twisted bit line structure. In the bit line twisting region, a memory cell (a memory cell gate electrode line) is arranged, and in a dummy word line region, a low-resistive metal interconnection line is arranged and is used as a low resistive, conductive line for word line lining. Therefore, in the bit line twisting region, accessible memory cell can be arranged and increased storage capacity can be provided without increase in array area. Furthermore, for the same storage capacity, a memory array area can be reduced.

Furthermore, a metal interconnection line for shifting the shunting interconnection line is arranged in a dummy word line region and it is not particularly necessary to provide a region for arranging the shifting metal interconnection. Memory cells can be arranged utilizing efficiently the memory array while suppressing an increase in memory array area.

Furthermore, owing to a memory cell capacitor of the CUB structure, the DRAM can be integrated on a common chip with a logic, and a semiconductor integrated circuit device such as a system LSI can have reduced chip area.

Second Embodiment

Figure 16:
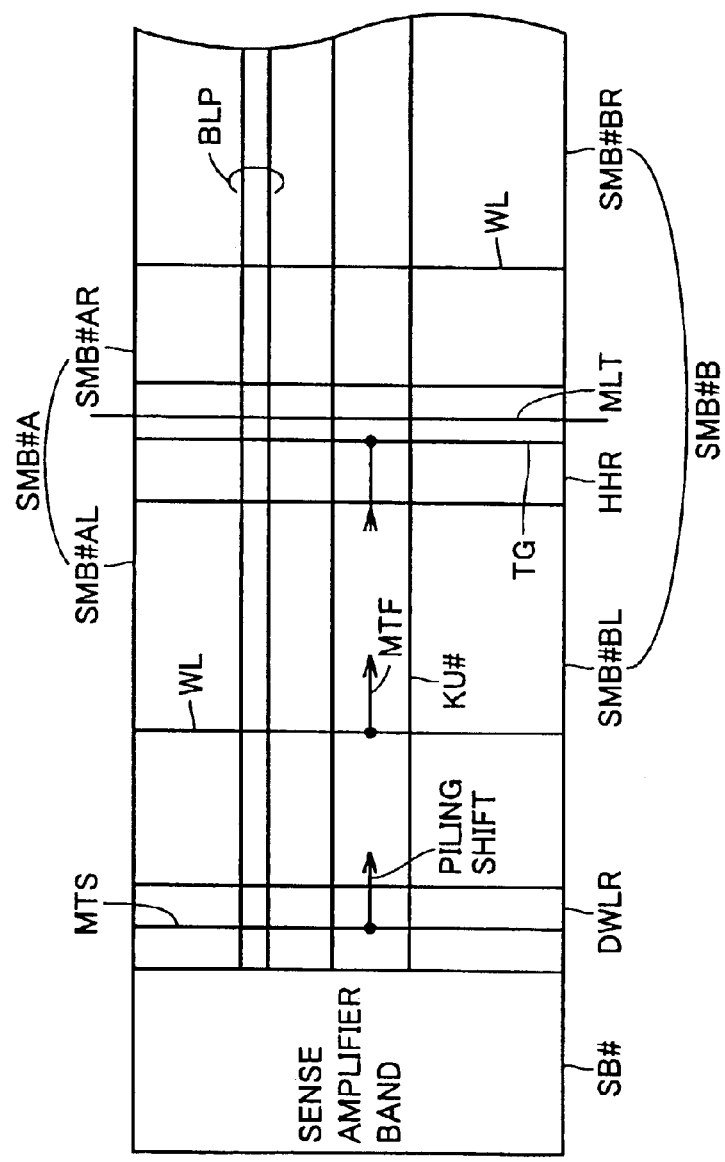
FIG. 16 schematically shows a configuration of an array portion of the semiconductor memory device according to a second embodiment of the present invention.

FIG. 16 schematically shows a configuration of an array portion of the semiconductor memory device according to a second embodiment of the present invention. FIG. 16 shows two sub memory blocks SMB#A and SMB#B divided by shunt region KU#. For sub memory blocks SMB#A and SMB#B, a sense amplifier band SB# is arranged, and adjacent to sense amplifier band SB#, a dummy word line region DWLR for arranging a dummy word line is provided. In dummy word line region DWLR, there are arranged a dummy cell gate electrode line forming a dummy word line, and metal interconnection line MTS overlying the dummy cell gate electrode line.

Common to sub memory blocks SMB#A and SMB#B, word line WL is arranged. Word line WL has a connection thereof shifted in shunt region KU# by a shifting interconnection line (the first metal interconnection line) MTS to implement a shunt structure.

Sub memory blocks SMB#A and SMB#B are divided into memory blocks SMB#AL, SMB#AR and memory blocks SMB#BL, SMB#BL, respectively, by an interconnection region HHR for arranging interconnection lines.

In interconnection region HHR, gate electrode line TG is arranged and is connected to a memory cell formed in interconnection region HHR. In interconnection region HHR, gate electrode line TG is connected to a low-resistive, metal interconnection line arranged corresponding to a word line arranged in sub memory block SMB#A or SMB#B by connection-shifting with shifting interconnection line MTS. A word line shunt configuration is thus implemented.

In sub memory blocks SMB#A and SMB#B, bit line pairs BLPs are arranged. FIG. 16 shows bit line BLP arranged in sub memory block SMB#A representatively. This bit line pair BLP extends in the column direction continuously and it does not have a crossing. For example, if a memory cell capacitor has the COB structure, it is not particularly necessary to provide a crossing on bit line pair BLP. In the second embodiment, even in the case of bit line pair BLP of a non-twisted structure, a word line shunt configuration is implemented through connection-shifting, a resultant interconnection free region is used as interconnection region HHR; and in interconnection region HHR, the second metal interconnection line is arranged.

In interconnection region HHR, there is provided a metal interconnection line MLT. Metal interconnection line MLT is, for example, a second metal interconnection line and transmits an internal voltage in DRAM, such as a high voltage VPP, a sense power supply voltage VCCS, a substrate bias voltage VBB, a cell plate voltage VCP or a bit line precharging voltage VBL. Interconnection region HHR is arranged inside an array in the row direction. By connecting metal interconnection line MLT to a voltage transmission line arranged at a periphery of the memory array, an internal voltage transmission line can be reduced in resistance, but increased in load capacitance and an internal voltage can stably be supplied.

Furthermore, if there is arranged, in word line shunt region KU#, a power source line transmitting a power supply voltage, or a ground voltage using a further upper, third metal interconnection line, arranging metal interconnection line MLT transmitting another internal voltage in interconnection region HHR can stabilize the internal voltage without increase in array area. In this configuration, if in interconnection region HHR, the second metal interconnection line is arranged as metal interconnection line MLT and electrically connected through a via hole to the third metal interconnection arranged in shunt region KU#, stable internal power supply/ground voltage can be transmitted.

Thus, according to the second embodiment of the present invention, a low-resistive metal interconnection line for word line shunt is arranged in a dummy word line region and a word line shunt configuration is implemented with the connection between a metal interconnection line and a gate electrode line shifted. A region for arranging a further upper metal interconnection line can be assured in a memory array, an internal voltage transmission line or other can be arranged, and stable internal voltage can be supplied.

Metal interconnection line MLT arranged in interconnection region HHR may be used as a signal line transmitting a signal such as a control signal.

Furthermore, similarly to the twisting region for implementing the twisted bit line arrangement, more than one interconnection region HHR may be provided. In addition, dummy word line region DWLR may be provided on each of opposite sides of memory blocks SMB#A and SMB#B, and from the opposite sides, a connection of word line shunt may be shifted.

Furthermore, interconnection region HHR may have any number of metal interconnections arranged therein.

Third Embodiment

Figure 17:
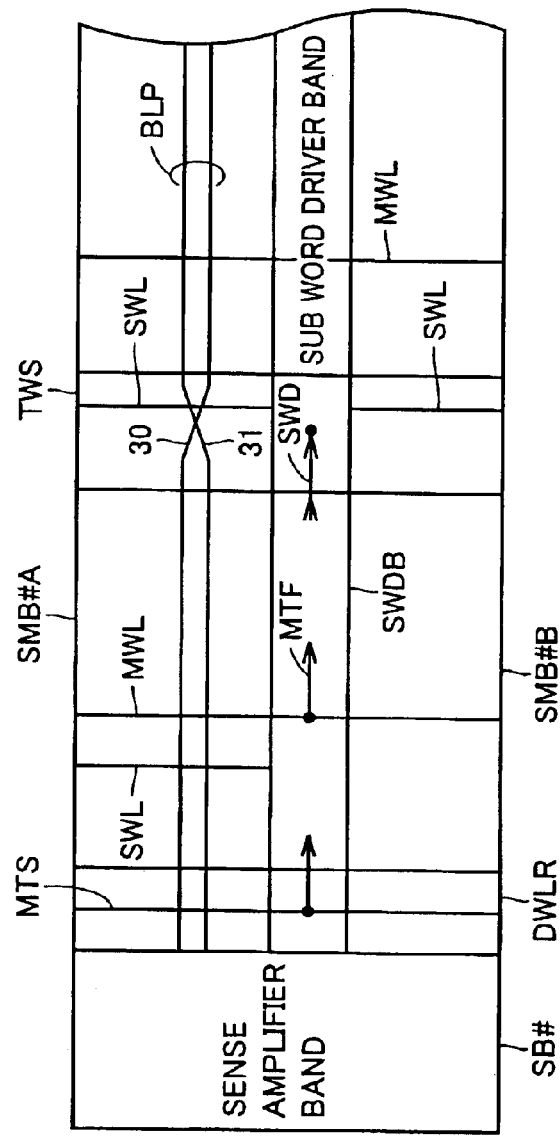
FIG. 17 schematically shows a configuration of an array portion of the semiconductor memory device according to a third embodiment of the present invention.

FIG. 17 schematically shows a configuration of an array portion of the semiconductor memory device according to a third embodiment of the present invention. In FIG. 17, a memory block is divided by a sub word driver band SWDB into sub memory blocks SMB#A and SMB#B. In a predetermined region of sub memory blocks SMB#A and SMB#B, a bit line twisting region TWS is arranged and in this region a bit line pair BLP is provided with a crossing by crossing interconnection lines 30 and 31 of first and second metal interconnection lines, respectively.

In sub memory block SMB#A, a sub word line (a row select line) SWL is arranged corresponding to a row of memory cells and is connected to memory cells on a corresponding row. A main word line MWL is arranged common to sub memory blocks SMB#A and SMB#B.

Adjacent to sub memory blocks SMB#A and SMB#B, dummy word line region DWLR is arranged, and adjacent to dummy word line region DWLR, sense amplifier band SAB# is provided. In dummy word line region DWLR, metal interconnection line MTS is arranged and used as main word line MWL to shift a route of connection between a main word line and a sub word line. Through the shifting of connection of the main word line, in bit line twisting region TWS, sub word line SWL connected to memory cells is arranged and in addition, a corresponding sub word driver SWD is arranged.

The sub word driver arranged in bit line interconnection region TWS receives a main word line select signal from a main word line placed at a shifted position. Therefore, even if in bit line twisting region TWS, crossing interconnection lines 30 and 31 for twisting bit lines are formed of the first and second metal interconnection lines, sub word driver SWD can be arranged in bit line twisting region TWS by forming sub word line SWL with a gate electrode line of the first polysilicon interconnection line, for example.

Sub word driver SWD arranged in bit line twisting region TWS receives a main word line select signal from a corresponding main word line on a shifted location of main word lines MWL arranged common to sub memory blocks SMB#A and SMB#B.

Figure 18:
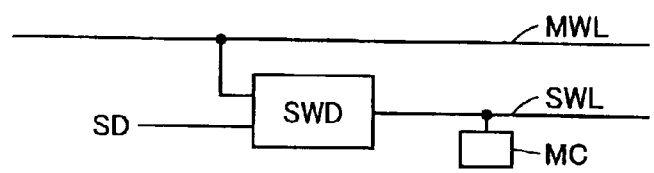
FIG. 18 schematically shows a configuration of a portion related to a sub word line of a sub word driver band shown in FIG. 17.

FIG. 18 schematically shows a connection between a main word line and a sub word line. As shown in FIG. 18, sub word driver SWD is arranged for each sub word line SWL. Sub word driver SWD, responsive to a signal on a corresponding main word line MWL and a sub decode signal SD, drives a corresponding sub word line SWL to a selected state. To sub word line SWL, memory cells MCs of a corresponding row are connected.

For a main word line MWL, a plurality of (four or eight, or other) sub word lines SWLs are arranged in a sub memory block. Therefore, even if main word line MWL is formed of the second metal interconnection line and sub word line SWL is constructed, for example, by the first polysilicon interconnection line, and a crossing is provided to bit line pair BLP, sub word line SWL can be arranged in a bit line twisting region. Owing to the arrangement of a plurality of sub word lines SWLs arranged corresponding to a single main word line MWL in bit line twisting region TWS, memory cells can be arranged efficiently utilizing the memory array through shifted connection between a main word line and sub word lines, to suppress increase in array area.

When the connection of main word line MWL is shifted, a dummy X decoder arranged corresponding to dummy word region DWLR may be used as a decode circuit that actually operates. Alternatively, connection between an X decoder and a main word line may be shifted in a direction opposite to that of shifting of shifting interconnection lines MTF in sub memory arrays SMB#A and SMB#B.

Furthermore, the number of sub word lines arranged in the bit line twisting region needs only to be determined based on the array configuration.

According to the third embodiment of the present invention, a metal interconnection line corresponding to a main word line is arranged in a dummy word line region, connection between the main word line and a sub word driver is shifted, and in a bit line twisting region, a sub word line is arranged and connection between a main word line and a sub word driver arranged in the bit line twisting region is also shifted. The bit line twisting region can be utilized for arranging memory cells and without increase in array area, increased storage capacity can be achieved. If a memory array is implemented with the same storage capacity, it can have a reduced area.

As described so far, according to the present invention, in a multilayer interconnection configuration, an upper, low-resistive metal interconnection line is arranged at a dummy word line region and the upper interconnection line is positionally displaced and connected to a corresponding, lower interconnection line. In a memory cell region at a region in which the upper interconnection line is arranged, an empty region can be provided, and necessary interconnection can efficiently be made in the memory cell array.

In particular, by providing a bit line crossing in a bit line twisting region using an upper interconnection line, a word line can be arranged in the bit line twisting region, and a memory array can efficiently be used to arrange the memory cells.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a plurality of memory cells arranged in rows and columns, said plurality of memory cells including normal memory cells storing data and dummy cells for maintaining a geometry of said normal memory cells;
   a plurality of row select lines, arranged corresponding to the memory cell rows, each connecting to memory cells on a corresponding row, the row select lines including a normal memory row select line connecting to the normal memory cells and a dummy row select line connecting to the dummy cells;
   a plurality of bit line pairs, arranged corresponding to the memory cell columns, each connecting to the memory cells on a corresponding column, said plurality of bit line pairs each selectively having a crossing in a preallotted twisting region, the twisting region having the row select line arranged therein, said crossing being formed using an interconnection line above the row select line and the bit line;
   a plurality of low-resistive, conductive lines arranged, in a region other than the twisting region, corresponding to the row select lines and extending in a row direction and electrically connected, in a predetermined region, to corresponding row select lines, the low-resistive, conductive line being formed in an interconnection layer above the row select lines; and shifting connection lines for connecting the low-resistive, conductive lines to corresponding row select lines in said predetermined region, said shifting connection lines including a connection line for electrically connecting the row select line arranged in the twisting region and a corresponding low-resistive, conductive line, and a connection line for electrically connecting, to a normal row select line, a low-resistive, conductive line arranged corresponding to the dummy row select line.

2. The semiconductor memory device according to claim 1, wherein said shifting connection lines electrically connect successively adjacent row select lines to successively adjacent, low-resistive, conductive lines, respectively.

3. The semiconductor memory device according to claim 1, wherein said shifting connection lines are arranged such that a pair of shifting connection lines arranged successively adjacent in a column direction electrically connect the low-resistive, conductive lines arranged corresponding to rows distant by a predetermined number of row(s) to corresponding row select lines.

4. The semiconductor memory device according to claim 3, wherein between the pair of the shifting connection lines, a shifting connection line for another row select line is arranged.

5. The semiconductor memory device according to claim 1, wherein the memory cells each include a capacitive element for storing data in an electric charge form, and said capacitive element has a cell plate electrode underlying the bit line and receiving a predetermined voltage, and a storage node electrode arranged facing to said cell plate electrode to store electric charges corresponding to the data.

6. A semiconductor memory device comprising:

a plurality of memory cells arranged in rows and columns and including normal cells for storing data and dummy cells arranged in a predetermined region;

a plurality of row select lines arranged corresponding to the respective memory cell rows and connecting to memory cells on corresponding rows, the row select lines including normal row select lines connecting to the normal cells and dummy row select lines connecting to the dummy cells, said dummy row select lines being arranged in said predetermined region concentrately;

a plurality of low-resistive, conductive lines provided corresponding to and above said plurality of row select lines; and a plurality of shifting connection lines for electrically connecting said plurality of low-resistive, conductive lines and the normal row select lines, the shifting connection lines including a connection line for electrically connecting a low-resistive, conductive line arranged in said predetermined region to a normal row select line of the normal row select lines.

7. A semiconductor memory device comprising:

a memory array having a plurality of memory cells, arranged in rows and columns, each for storing data;

a plurality of bit line pairs arranged corresponding to the memory cell columns and connecting to memory cells on corresponding columns, each bit line pair including first and second bit lines, said first and second bit lines selectively having a crossing portion for exchanging positions of said first and second bit lines on a predetermined region of said memory array, said crossing portion having an interconnection line in a first interconnection layer and an interconnection line in a second interconnection layer above said first interconnection layer, said first and second bit lines being formed in said first interconnection layer in a region other than said crossing portion; and a plurality of row select lines, arranged corresponding to the memory cell rows, each connecting to the memory cells on a corresponding row, the row select line being formed by an interconnection line in an interconnection layer below said first interconnection layer, said plurality of row select lines including an externally accessible row select line formed in said predetermined region and connected to a row of memory cells arranged in said predetermined region.

* * * * *